(12) United States Patent
Jang et al.

(10) Patent No.: US 6,924,242 B2
(45) Date of Patent: Aug. 2, 2005

(54) SIOC PROPERTIES AND ITS UNIFORMITY IN BULK FOR DAMASCENE APPLICATIONS

(75) Inventors: Syun-Ming Jang, Hsin-Chu (TW); Chung-Chi Ko, Nantou (TW); Tien-I Bao, Hsin-chu (TW); Lih-Ping Li, Hsin-Chu (TW); Al-Sen Liu, Hsin Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/692,030

(22) Filed: Oct. 23, 2003

(65) Prior Publication Data

US 2005/0090122 A1 Apr. 28, 2005

(51) Int. Cl.[7] ............................................. H01L 21/26
(52) U.S. Cl. ........................................ 438/795; 438/781
(58) Field of Search ................................. 438/475, 660, 438/761–765, 780, 781, 795–798

(56) References Cited

U.S. PATENT DOCUMENTS

| | | | |
|---|---|---|---|
| 6,114,259 A | * 9/2000 | Sukharev et al. | 438/789 |
| 6,323,121 B1 | 11/2001 | Liu et al. | 438/633 |
| 6,323,125 B1 | 11/2001 | Soo et al. | 438/645 |
| 6,348,407 B1 | 2/2002 | Gupta et al. | 438/637 |
| 6,372,661 B1 | 4/2002 | Lin et al. | 438/769 |
| 6,635,508 B2 | * 10/2003 | Arai et al. | 438/99 |
| 2003/0010961 A1 | * 1/2003 | Fukuyama et al. | 252/570 |
| 2003/0203652 A1 | * 10/2003 | Bao et al. | 438/783 |
| 2004/0023497 A1 | * 2/2004 | Pan et al. | 438/694 |

* cited by examiner

*Primary Examiner*—David Nelms
*Assistant Examiner*—Calvin Lee
(74) *Attorney, Agent, or Firm*—Haynes and Boone, LLP

(57) ABSTRACT

A method of forming a low-k dielectric material layer comprising the following steps. A first dielectric material sub-layer is formed over a substrate. The first dielectric material sub-layer is treated with an energy treatment to form a hardened layer on the upper surface of the first dielectric material sub-layer. A second dielectric material sub-layer is formed over the hardened layer, wherein the first dielectric sub-layer, the hardened layer and the second dielectric sub-layer comprise the low-k dielectric material layer. And a dual damascene structure and a dielectric material structure formed thereby.

30 Claims, 3 Drawing Sheets

*First Embodiment*

Second Embodiment

SIOC PROPERTIES AND ITS UNIFORMITY IN BULK FOR DAMASCENE APPLICATIONS

FIELD OF THE INVENTION

The present invention relates generally to semiconductor fabrication and more specifically to formation of SiOC dielectric layers.

BACKGROUND OF THE INVENTION

Chemical vapor deposition (CVD) low-k dielectric materials with good mechanical and electrical strengths are in demand for damascene applications U.S. Pat. No. 6,372,661 B1 to Lin et al. describes SiOC films and post-treatments.

U.S. Pat. No. 6,348,407 to Gupta et al. describes a plasma treatment of a low-k layer and an etch stop layer in a dual damascene process.

U.S. Pat. No. 6,323,125 B1 to Soo et al. describes a plasma treatment and PPMSO layer in a dual damascene process.

U.S. Pat. No. 6,323,121 B1 to Liu et al. describes a dual damascene process with etch stops and a plasma treatment.

SUMMARY OF THE INVENTION

Accordingly, it is an object of one or more embodiments of the present invention to provide an method of improving the properties of SiOC dielectric material layers.

It is another object of the present invention to provide a method of forming an embedded hard layer within an SiOC dielectric material layer, and structures formed thereby.

Other objects will appear hereinafter.

It has now been discovered that the above and other objects of the present invention may be accomplished in the following manner. Specifically, a first dielectric material sub-layer is formed over a substrate. The first dielectric material sub-layer is treated with an energy treatment to form a hardened layer on the upper surface of the first dielectric material sub-layer. A second dielectric material sub-layer is formed over the hardened layer, wherein the first dielectric sub-layer, the hardened layer and the second dielectric sub-layer compise the low-k dielectric material layer. And a dual damascene structure and a dielectric material structure formed thereby.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
FIGS. 1 to 6 schematically illustrate a first preferred embodiment of the present invention.

First Embodimet—FIGS. 1 Through 6
Initial Structure—FIG. 1

As shown in FIG. 1, structure 10 is preferably a silicon (Si), germanium (Ge) or gallium arsenide (GaAs) substrate, is more preferably a silicon substrate. Structure 10 is understood to possibly include a semiconductor wafer or substrate, active and passive devices formed within the wafer or substrate, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

As described below, a dielectric layer 24 to be formed over the structure 10 will have a total thickness of 12 and will have a trench formed therein at thickness 14. Dielectric layer 24 is preferably a low-k dielectric layer, i.e. having a dielectric constant (k) of less than about 3.0.

Dielectric layer 24 may be, for example, an intermetal dielectric (IMD) layer. The deposition of dielectric layer 24 is stopped to provide the hydrogen treatment 18 and then started to complete formation of dielectric layer 24.

Formation of Lower Dielectric Sub-Layer 16 to a Thickness 14

Figure 2:
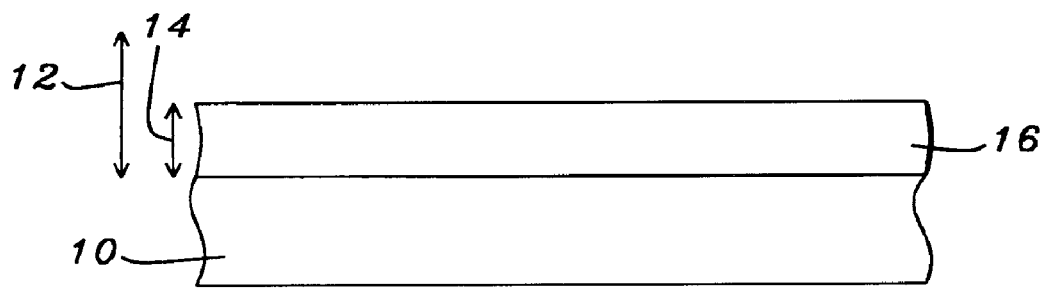

As shown in FIG. 2, a lower dielectric sub-layer 16 of dielectric layer 24 is formed over structure 10 to a thickness 14 at which a trench will be formed above this thickness 14. Lower dielectric sub-layer 16 is preferably comprised of SiOC having a dielectric constant (k) of preferably from about 2.3 to 2.6, more preferably from about 2.4 to 2.6 and most preferably greater than about 2.3 as will be used for illustrative purposes hereafter.

Lower SiOC dielectric sub-layer 16 is preferably formed by a chemical vapor deposition (CVD) process using the following parameters:

temperature: preferably from about 250 to 450° C. and more preferably from about 300 to 400° C.;

pressure: preferably from about 4.5 to 6.5 mTorr and more preferably from about 5.0 to 6.0 mTorr;

time: preferably from about 40 to 60 seconds and more preferably from about 45 to 55 seconds (depending upon how much thickness is desired to be deposited); and power: preferably from about 1500 to 3000 W and more preferably from about 1800 to 2700 W.

Energy Treatment 18 to Improve Film Properties and to Form Hard Layer 20

Figure 3:
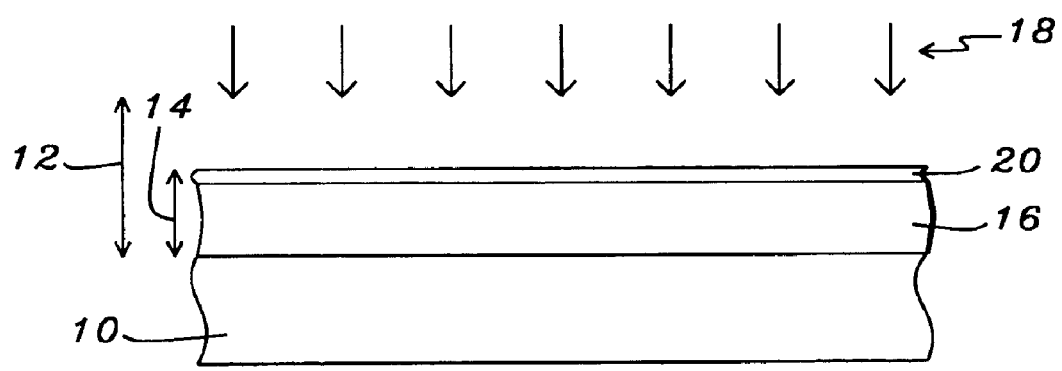

As shown in FIG. 3, the CVD deposition process is stopped and lower SiOC dielectric sub-layer 16 is subjected to an energy treatment 18 to improve the film properties of lower SiOC dielectric sub-layer 16 and to convert an upper portion of lower SiOC sub-layer 16 to hard layer 20.

Hard layer 20 has a thickness 14 of preferably from about 250 to 500Å and more preferably from about 350 to 450Å. The thickness 14 of lower SiOC dielectric sub-layer 16 denotes the lower depth to which a subsequent trench will be formed within SiOC dielectric layer 24.

The improved film properties of lower SiOC dielectric sub-layer 16 include lowering the dielectric constant (k), improving mechanical properties such as hardness, Young modulus, peeling strength and Stress Migration (SM) and improving electrical properties such as the breakdown voltage, leakage current density and Time-Dependent Dielectric Breakdown (TDDB) Failure.

Energy treatment 18 is preferably a hydrogen treatment, as will be used for purposes of illustration hereafter, and may be performed in situ or ex situ in a separate chamber and is more preferably performed ex-site because of different temperature between deposition and treatment chambers.

Hydrogen treatment 18 is preferably a plasma treatment comprising under the following conditions:

$H_2$ flow: from about 1600 to 2400 sccm and more preferably from about 1800 to 2200 sscm;

temperature: preferably from about 300 to 450° C. and more preferably from about 350 to 400° C.;

pressure: preferably from about 4.5 to 9.0 mTorr and more preferably from about 6.0 to 7.5 mTorr;

time: preferably from about 30 to 240 seconds and more preferably from about 90 to 180 seconds; and power: preferably from about 300 to 1500 W and more preferably from about 600 to 1200 W.

Formation of Upper Dielectric Sub-Layer 22

Figure 4:
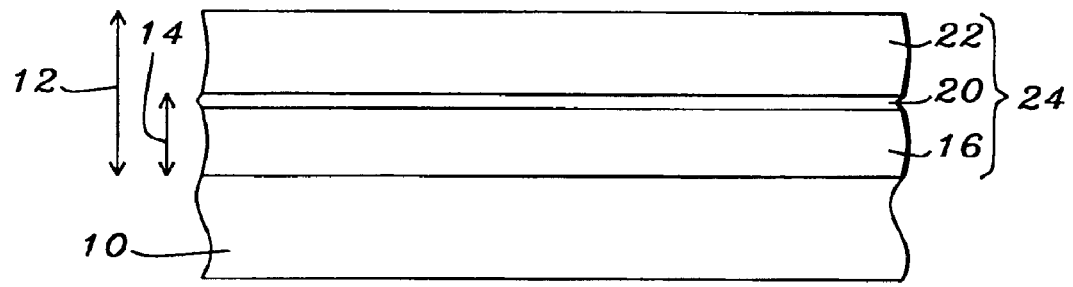

As shown in FIG. 4, an upper dielectric sub-layer 22 is formed over hard layer 20 to a thickness of preferably from about 2000 to 3000Å and more preferably from about 2200 to 2800Å to complete formation of dielectric layer 24 having embedded hard layer 20 formed therein. Upper dielectric sub-layer 22 is preferably comprised of SiOC having a dielectric constant (k) of from about 2.3 to 2.6, more preferably from about 2.4 to 2.6 and most preferably greater than about 2.3 as will be used for illustrative purposes hereafter.

Upper SiOC dielectric sub-layer 22 is preferably formed by a chemical vapor deposition (CVD) process using the following parameters:

temperature: preferably from about 250 to 450° C. and more preferably from about 300 to 400° C.;

pressure: preferably from about 4.5 to 6.5 mTorr and more preferably from about 5.0 to 6.0 mTorr;

time: preferably from about 40 to 60 seconds and more preferably from about 45 to 55 seconds; and power: preferably from about 1500 to 3000 W and more preferably from about 1800 to 2700 W.

Formation of Dual Damascene Opening 34

Figure 5:
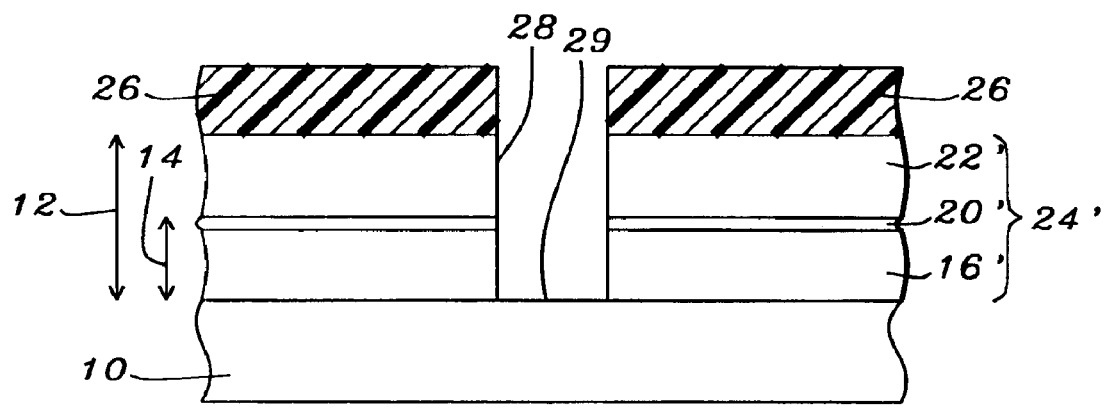
Figure 6:
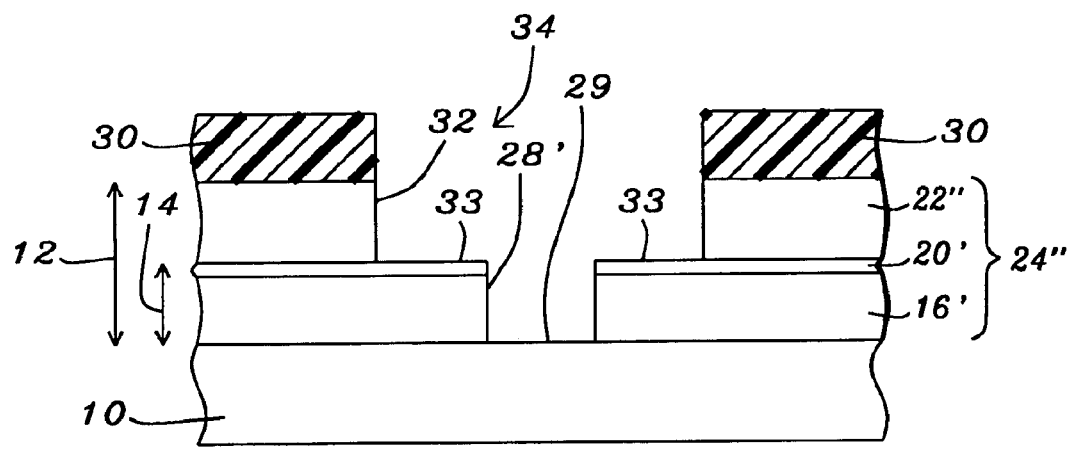

As shown in FIGS. 5 and 6 the structure of FIG. 4 may be utilized in the formation of a damascene of dual damascene opening 34 as shown in FIG. 6 wherein hard layer 20 may function as an etch stop layer in the formation of trench opening 32 as described below. Hard layer 20 may function as an etch stop layer by having a lower etch rate than the adjacent dielectric sub-layers 16, 22 and/or by an endpoint signal change.

As shown in FIG. 5, dielectric layer 24 is patterned to form a via opening 28 exposing a portion 29 of structure 10. Dielectric layer 24 may be patterned using, for example, an overlying first patterned mask layer 26 that may be comprised of, for example, photoresist as shown in FIG. 5.

For example, using first patterned mask layer 26, upper SiOC dielectric sub-layer 22, hard layer 20 and lower SiOC dielectric sub-layer 16 are patterned to form via opening 28 therethrough. First patterned mask layer 26 is then removed and the structure may be cleaned.

As shown in FIG. 6, using patterned hard layer 20' as an etch stop layer, upper patterned SiOC dielectric sub-layer 22' is again patterned to form trench opening 32 over reduced via opening 28' exposing portions 33 of hard layer 20'. Upper patterned SiOC dielectric sub-layer 22' may be patterned using, for example, an overlying second patterned mask layer 30 that may be comprised of, for example, photoresist as shown in FIG. 6. Second patterned mask layer 30 may then be removed and the structure may be cleaned.

The upper patterned SiOC dielectric sub-layer 22"/layer 24" may then be subjected to another hydrogen treatment 18 to further improve the film properties. The $H_2$ treat at the upper layer of low-k which can serve as a capped layer.

A dual damascene structure (not shown) may then be formed within dual damascene opening 34.

It is noted that more than one etch stop layer 20 may be formed embedded within SiOC dielectric layer 24 by performing hydrogen treatments 18 at varying thicknesses during the formation of SiOC dielectric layer 24 in accordance with the teachings of the present invention.

Figure 7:
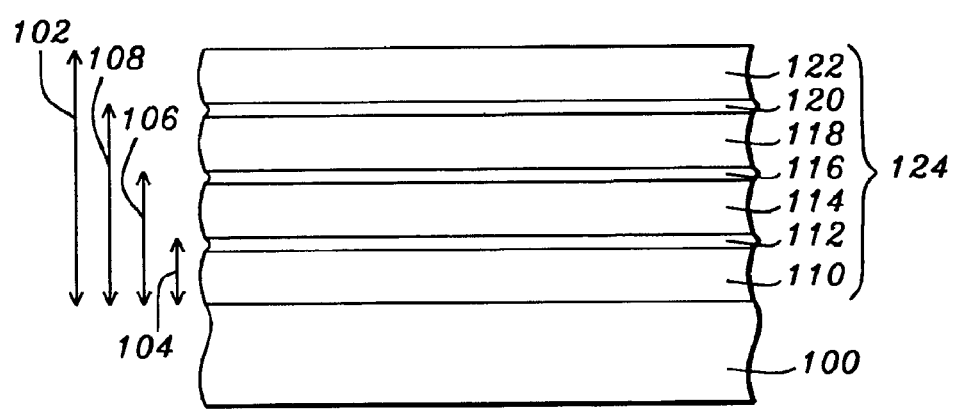
FIG. 7 schematically illustrates a second preferred embodiment of the present invention.

Second Embodiment—FIG. 7

As shown in FIG. 7, if a dielectric layer 124 to be formed will not include one or more etch stop layer(s), or if the dielectric constant (k) of the dielectric layer as initially formed are greater than about 2.8, then multiple hydrogen treatment 18 may be employed to further enhance, and improve the uniformity of, the film properties of dielectric layer 124 and to form numerous hard layers 112, 116, 120 embedded within dielectric layer 124. In the case of a dielectric layer 124 having a dielectric constant greater than about 2.8 as initially formed, the dielectric constant is not necessarily intended to be improved through the use of the multiple hydrogen treatments 18. Dielectric layer 124 is preferably a low-k dielectric layer, i.e. having a dielectric constant (k) of less than about 3.0

For example, as shown in FIG. 7, three separate hydrogen treatments 18 may be conducted during the deposition of dielectric layer 124 at thicknesses 104, 106 and 108 of respective dielectric sub-layers 110, 114 and 118. The upper dielectric sub-layer 122 is not subjected to hydrogen treatment 18 and the $H_2$ treat at the upper layer of low-k can serve as a CMP capped layer, and doesn't need to be further treated.

Each respective hydrogen treatment 18 is conducted under analogous conditions as hydrogen treatment 18 described in the first embodiment.

The dielectric layer 124 and the dielectric sub-layers 110, 114, 118 are preferably comprised of SiOC as will be used for illustrative purposes hereafter and may have varying dielectric constants (k) of from about 2.3 to 2.6, from about 2.4 to 2.6 and greater than about 2.8, for example.

As shown in FIG. 7, structure 10 is preferably a silicon (Si), germanium (Ge) or gallium arsenide (GaAs) substrate, is more preferably a silicon substrate. Structure 10 is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

As taught in the first embodiment, lower SiOC dielectric sub-layer 110 having a thickness 104 is formed over structure 100 and is then subjected to a hydrogen treatment 18 to enhance, and improve the uniformity of, the film properties of the lower SiOC dielectric sub-layer 110 and which forms lower hard layer 112.

Middle SiOC dielectric sub-layer 114 having a thickness 106 minus thickness 104 is formed over lower hard layer 112 and is then subjected to a hydrogen treatment 18 to enhance, and improve the uniformity of, the film properties of the middle hard layer 110 and which forms middle hard layer 116.

Upper SiOC dielectric sub-layer 118 having a thickness 108 minus thickness 106 is formed over middle hard layer 116 and is then subjected to a hydrogen treatment 18 to enhance, and improve the uniformity of, the film properties of the upper dielectric sub-layer 118 and which forms upper hard layer 120.

Uppermost SiOC dielectric sub-layer 122 having a thickness 102 minus thickness 108 is formed over upper hard layer 120 which completes formation of SiOC dielectric layer 124. The uppermost SiOC dielectric sub-layer 122 is not subjected to hydrogen treatment 18.

It is noted that although FIG. 7 illustrates SiOC dielectric layer 124 being comprised of four SiOC dielectric sub-layers with respective embedded hard layers interposed therebetween SiOC dielectric layer 124 may be comprised of only three SiOC dielectric sub-layers with respective embedded hard layers interposed therebetween or more than four SiOC dielectric sub-layers with respective embedded hard layers interposed therebetween.

Advantages of the Present Invention

The advantages of one or more embodiments of the present invention include:

1. the dielectric constant of the entire dielectric layer so formed is improved;

2. the dielectric constant, select mechanical properties and select electrical properties of the entire dielectric layer so formed are improved;

3. the uniformity of the dielectric constant, select mechanical properties and select electrical properties of the entire dielectric layer so formed is improved;

4. packaging compatibility is improved due to the increase mechanical strength of the entire dielectric layer so formed;

5. arcing is reduced due to the increased breakdown strength of the entire dielectric layer so formed; and 6. one or more of the hard layers formed between the sub-layers comprising the entire dielectric layer so formed may be used as etch stop layers for subsequent etching of the entire dielectric layer so formed.

While particular embodiments of the present invention have been illustrated and described, it is not intended to limit the invention, except as defined by the following claims.

We claim:

1. A method of forming a low-k dielectric material layer, comprising the steps of:
   forming a first dielectric material sub-layer over a substrate;
   treating the first dielectric material sub-layer with an energy treatment to form a hardened layer on the upper surface of the first dielectric material sub-layer; and
   forming a second dielectric material sub-layer over the hardened layer;
   wherein the first dielectric material sub-layer, the hardened layer and the second dielectric material sub-layer comprise the low-k dielectric material layer.

2. The method of claim 1, wherein the first dielectric material sub-layer is comprised of SiOC.

3. The method of claim 1, wherein the first dielectric material sub-layer has a dielectric constant of from about 2.3 to 2.6.

4. The method of claim 1, wherein the first dielectric material sub-layer has a dielectric constant of greater than about 2.8.

5. The method of claim 1, wherein the hardened layer has a thickness of from about 250 to 500Å.

6. The method of claim 1, wherein the hardened layer has a thickness of from about 300 to 450Å.

7. The method of claim 1, wherein the energy treatment is conducted in situ.

8. The method of claim 1, wherein the energy treatment is conducted ex situ.

9. The method of claim 1, wherein the energy treatment is conducted using $H_2$.

10. The method of claim 1, wherein the energy treatment is conducted under the following conditions:
    $H_2$ flow: from about 1600 to 2400 sccm;
    temperature: from about 300 to 450° C.;
    pressure: from about 4.5 to 9.0 m Torr;
    time: from about 30 to 240 seconds; and
    power: from about 300 to 1500 W.

11. The method of claim 1, wherein the energy treatment is conducted under the following conditions:
    $H_2$ flow: from about 1800 to 2200 sccm;
    temperature: from about 350 to 400° C.;
    pressure: from about 6.0 to 7.5 mTorr;
    time: from about 90 to 180 seconds; and
    power: from about 600 to 1200 W.

12. The method of claim 1, wherein the hardened layer is an etch stop layer.

13. The method of claim 1, including the steps of:
    patterning the second dielectric material sub-layer, the hardened layer and the first dielectric material sub-layer to form a via opening exposing a portion of the substrate; and
    then, using the hardened layer as an etch stop layer, patterning the second dielectric material sub-layer to form a trench opening over the via opening and exposing portions of the hardened layer.

14. The method of claim 1, including the steps of:
    patterning the second dielectric material sub-layer, the hardened layer and the first dielectric material sub-layer to form a via opening exposing a portion of the substrate; and
    then, using the hardened layer as an etch stop layer, patterning the second dielectric material sub-layer to form a trench opening over the via opening and exposing portions of the hardened layer;
    the trench opening and the via opening comprising a dual damascene opening.

15. The method of claim 1, including the steps of:
    patterning the second dielectric material sub-layer, the hardened layer and the first dielectric material sub-layer using an overlying first patterned mask layer to form a via opening exposing a portion of the substrate; and
    then, using the hardened layer as an etch stop layer, patterning the second dielectric material sub-layer using an overlying second pattern mask layer to form a trench opening over the via opening and exposing portions of the hardened layer.

16. A method of forming a dielectric material layer, comprising the steps of:
    sequentially forming one or more dielectric material sub-layers over a structure;
    treating each sequentially formed one or more dielectric material sub-layers in sequence with a respective hydrogen treatment to form respective hard layers on the upper surface of each respective sequentially formed one or more dielectric material sub-layers; and
    forming an uppermost dielectric material sub-layer over the sequentially formed one or more dielectric material sub-layers and respective hard layers to complete formation of the dielectric material layer;
    wherein the one or more of the respective hard layers are etch stop layers.

17. The method of claim 16, wherein the sequentially formed one or more dielectric material sub-layers are each comprised of SiOC.

18. The method of claim 16, wherein the sequentially formed one or more dielectric material sub-layers each have a dielectric constant of from about 2.3 to 2.6.

19. The method of claim 16, wherein the sequentially formed one or more dielectric material sub-layers each have a dielectric constant of greater than about 2.8.

20. The method of claim 16, wherein each of the respective hard layers has a thickness of from about 250 to 500Å.

21. The method of claim 16, wherein each of the respective hard layers has a thickness of from about 300 to 450Å.

22. The method of claim 16, wherein the one or more respective hydrogen treatments are conducted in situ.

23. The method of claim 16, wherein the one or more respective hydrogen treatments are conducted ex situ.

24. The method of claim 16, wherein the one or more respective hydrogen treatments are conducted using $H_2$.

25. The method of claim 16, wherein the one or more respective hydrogen treatments are conducted under the following conditions:

$H_2$ flow: from about 1600 to 2400 sccm;

temperature: from about 300 to 450° C.;

pressure: from about 4.5 to 9.0 mTorr;

time: from about 30 to 240 seconds; and power: from about 300 to 1500 W.

26. The method of claim 16, wherein the one or more respective hydrogen treatments are conducted under the following conditions:

$H_2$ flow: from about 1800 to 2200 sccm;

temperature: from about 350 to 400° C.;

pressure: from about 6.0 to 7.5 mTorr;

time: from about 90 to 180 seconds; and power: from about 600 to 1200 W.

27. The method of claim 16, wherein there is one dielectric material sub-layer having a hard layer thereover by the respective hydrogen treatment; and including the steps of:

patterning the uppermost dielectric material sub-layer, the hard layer and the one dielectric material sub-layer using an overlying first patterned mask layer to form a via opening exposing a portion of the structure; and then, using the hard layer as an etch stop layer, patterning the uppermost dielectric material sub-layer using an overlying second patterned mask layer 30 to form a trench opening over the via opening and exposing portions of the hard layer.

28. The method of claim 16, wherein there is one dielectric material sub-layer having a hard layer formed thereover by the respective hydrogen treatment.

29. The method of claim 16, wherein there is one dielectric material sub-layer having a hard layer formed thereover by the respective hydrogen treatment; and including the steps of:

patterning the uppermost dielectric material sub-layer, the hard layer and the one dielectric material sub-layer to form a via opening exposing a portion of the structure; and then, using the hard layer as an etch stop layer, patterning the uppermost dielectric material sub-layer to form a trench opening over the via opening and exposing the portions of the hard layer.

30. The method of claim 16, wherein there is one dielectric material sub-layer having a hard layer formed thereover by the respective hydrogen treatment; and including the steps of:

patterning the uppermost dielectric material sub-layer, the hard layer and the one dielectric material sub-layer to form a via opening exposing a portion of the structure; and then, using the hard layer as an etch stop layer, patterning the uppermost dielectric material sub-layer to form a trench opening over the via opening and exposing portions of the hard layer;

the trench opening and the via opening comprising a dual damascene opening.

* * * * *